(12) United States Patent
Rehmann

(10) Patent No.: US 7,352,293 B1
(45) Date of Patent: Apr. 1, 2008

(54) MULTI-MODE ENCODER OUTPUT GENERATOR

(75) Inventor: David A. Rehmann, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/739,079

(22) Filed: Apr. 23, 2007

(51) Int. Cl.
H03M 1/22 (2006.01)
(52) U.S. Cl. ............................................. 341/11; 341/3
(58) Field of Classification Search ................. 341/11, 341/3, 15, 9
See application file for complete search history.

(56) References Cited

U.S. PATENT DOCUMENTS

| | | | |
|---|---|---|---|
| 2,848,698 A | 4/1957 | Howey et al. | 400/88 |
| 4,312,007 A | 1/1982 | Winfield | 347/14 |
| 4,922,268 A | 5/1990 | Osborne | 347/19 |
| 5,121,327 A | 6/1992 | Salazar | 338/1.3 |
| 5,126,754 A | 6/1992 | Spinar | 347/40 |
| 5,191,336 A * | 3/1993 | Stephenson | 341/111 |
| 5,593,236 A | 1/1997 | Bobry | 347/14 |
| 5,937,145 A | 8/1999 | Garboden et al. | 358/1.3 |
| 6,017,114 A | 1/2000 | Elgee et al. | 347/40 |
| 6,302,506 B1 | 10/2001 | Norton | 347/79 |
| 6,302,514 B1 | 10/2001 | Eade et al. | 347/33 |
| 6,515,445 B2 * | 2/2003 | Shoji et al. | 318/696 |
| 6,654,508 B1 | 11/2003 | Markham | 382/291 |
| 6,772,088 B2 * | 8/2004 | Nekado et al. | 702/158 |
| 6,791,995 B1 * | 9/2004 | Azenkot et al. | 370/436 |
| 2002/0196308 A1 | 12/2002 | Cole | 347/37 |
| 2004/0135076 A1 | 7/2004 | Martenson et al. | 250/231.13 |
| 2005/0179717 A1 | 8/2005 | Eaton | 347/79 |
| 2005/0200638 A1 | 9/2005 | Silverbrook et al. | 347/2 |
| 2006/0038843 A1 | 2/2006 | Chen | 347/14 |

* cited by examiner

Primary Examiner—Peguy JeanPierre

(57) ABSTRACT

Various apparatus and methods of a multi-mode encoder output generator are disclosed.

20 Claims, 6 Drawing Sheets

MULTI-MODE ENCODER OUTPUT GENERATOR

CROSS-REFERENCE TO RELATED PATENT APPLICATIONS

The present application is related to co-pending U.S. patent application Ser. No. 11/490,577 filed on Jul. 21, 2006 by David A. Rehmann and David Kurt Klaffenbach and entitled ENCODER, the full disclosure of which is hereby incorporated by reference.

BACKGROUND

Encoders are sometimes used to sense movement of an object. Such encoders may be subject to errors such as duty cycle errors and channel phase errors.

DETAILED DESCRIPTION OF THE EXAMPLE EMBODIMENTS

Figure 1:
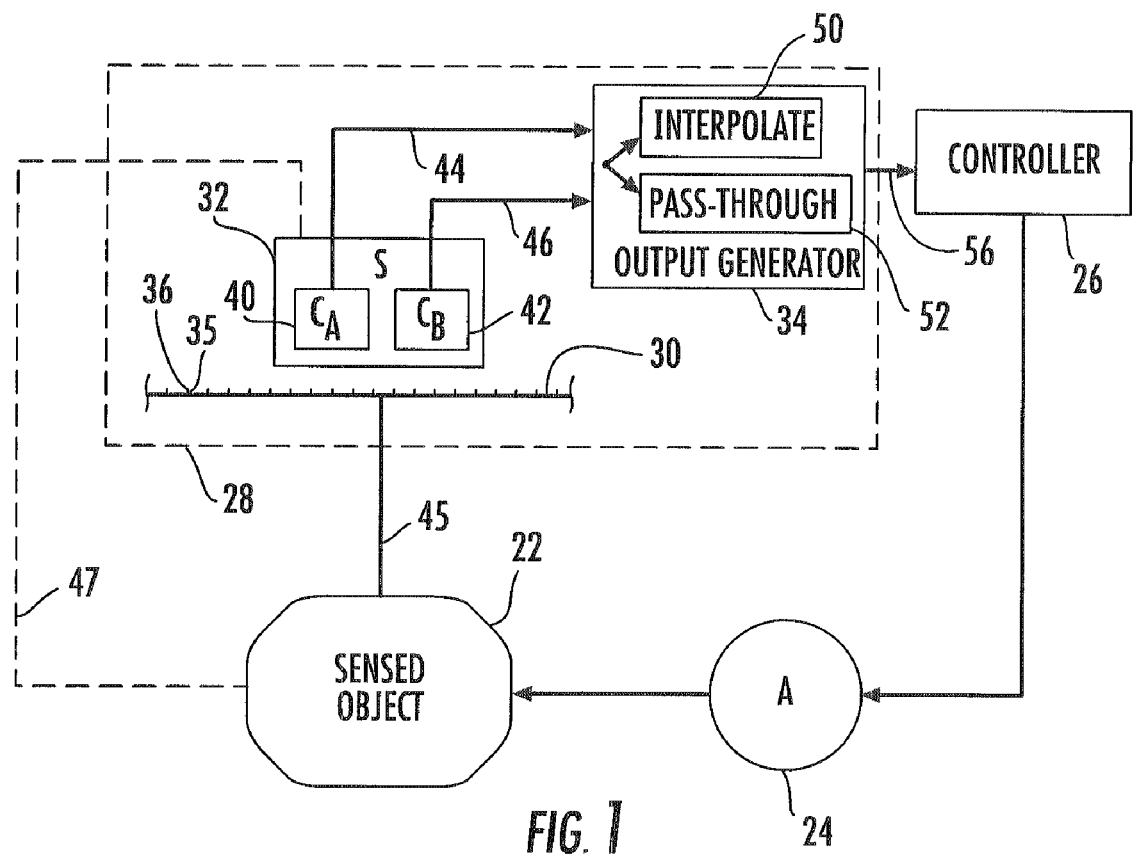
FIG. 1 is a schematic illustration of a control system according to an example embodiment.

FIG. 1 schematically illustrates control system 20 according to one example embodiment. Control system 20 provides closed loop control over the positioning of a sensed object 22. As will be described hereafter, control system 20 utilizes an encoder system 28 that operates in multiple modes to provide more accurate control over positioning of object 22. Control system 20 includes object 22, actuator 24, controller 26 and encoder system 28.

Object 22 comprises any object, such as a mechanical component or the like, over which positional control is desired. In one embodiment, object 22 may be an object which is to be rotated in a controlled manner about an axis. Examples of such objects include, but are not limited to, drums, rollers, wheels and the like. For example, in one embodiment object 22 may comprise a drum carrying printing material to be deposited upon a print medium or a drum caring a medium onto which printed material is to be deposited. In other embodiments, object 22 may be an object which is to linearly or arcuately translate. For example, in one embodiment, object 22 may comprise one or more print heads which are carried by a carriage that linearly translates as it is scanned across a medium. In still other embodiments, object 22 may have other configurations and other uses.

Actuator 24 comprises a mechanism configured to move object 22. In one embodiment, actuator 24 may be configured to rotate object 22 about one or more axes. In yet another embodiment, actuator 24 may comprise a mechanism configured to linearly or arcuately translate object 22. In one embodiment, actuator 24 may comprise a motor and a transmission for delivering torque from the motor to the object so as to rotate the object or so as to convert the torque so as to linearly or arcuately translate or move the object. Examples of such a transition may include one or more gear trains, chain and sprocket arrangements, belt and pulley arrangements, cam and cam follower arrangements and the like. In yet other embodiments, actuator 24 may comprise a hydraulic or pneumatic cylinder-piston assembly or an electric solenoid, wherein linear motion from such is transmitted by a transmission to object 22 to rotate or translate object 22. Actuator 24 may have any of a variety of different configurations for generating and transmitting motion to object 22.

Controller 26 comprises one or more processing units configure to generate control signals for directing operation of actuator 24 so as to move object 22. For purposes of this application, the term "processing unit" shall mean a presently developed or future developed processing unit that executes sequences of instructions contained in a memory. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hard wired circuitry may be used in place of or in combination with software instructions to implement the functions described. For example, controller 26 may be embodied as part of one or more application-specific integrated circuits (ASICs). Unless otherwise specifically noted, the controller is not limited to any specific combination of hardware circuitry and software, nor to any particular source for the instructions executed by the processing unit. Controller 26 generates such control signals which ultimately control the positioning of object 22 as well as potentially its velocity and acceleration between different positions based at least partially upon signals from encoder system 28.

Encoder system 28 comprises a system configured to detect movement of object 22 and to produce output signals representative of such movement. As will be described, encoder system 28 operates in multiple modes to increase its accuracy and reliability. In particular, encoder system 28 switches between different modes to output signals even when object 22 is undergoing slow or erratic movement and to also output more accurate signals when object 22 is moving at generally higher and more uniform velocities. As a result, the positioning of object 22 by actuator 24 based upon control signals from controller 26 is also more accurate and reliable.

Encoder system 28 includes encoder track 30, sensor 32 and output generator 34. encoder track 30 comprises a series of notches, slits, markings or other structures or surface treatments (hereafter referred to as marks 35) having edges 36 equidistantly spaced from one another by predetermined increments and configured to be sensed by sensor 32. In the example illustrated, marks 35 comprise a multitude of slits or transparent lines configured to permit passage of light, wherein portions of track 30 between marks 35 in or up the transmission of light. In other embodiments, track 30 may have other configurations.

Sensor 32 comprises a device configured to sense relative movement between track 30 and sensor 32. In particular, sensor 32 is configured to generate a signal as an edge 36 and sensor 32 move relative to one another. In the particular example illustrated, sensor 32 comprises an optical sensor having a light emitter element in a light sensing element on opposite sides of track 30. As track and 30 is moved relative to sensor 32 or as Sensor 32 is moved relative to track 30 (or both), the light from the emitter element being received by the sensing element is repeatedly interrupted by those portions of each order track 30 between marks 35, wherein sensor 32 generates pulses are signals based upon such repeated interruptions.

As shown by FIG. 1, sensor 32 includes a first channel 40 and a second channel 42, wherein each of channels 40, 42 senses transitioning of edges 36. For example, Channel 40 senses both (1) positive, leading or rising edges and (2) negative, trailing or falling edges 36 associated with each mark 35. Channel 42 also senses both positive, leading or rising edges and negative, trailing or falling edges 36 associated with each mark 35.

Channels 40, 42 are out of phase with respect to one another. For example, in one embodiment, channel 40 and channel 42 are out of phase with one another by 90 degrees. As a result, sensor 32 may not only detect speed but may also detect direction. According to one embodiment, sensor 32 comprises a quadrature encoder, wherein channel 40 comprises channel A and wherein channel 42 comprises channel B. In other embodiments, other encoder track sensing devices may be employed.

In the particular example illustrated, as indicated by solid lines 45, encoder track 30 is physically coupled or connected to object 22 so as to move with object 22. In such an embodiment, sensor 32 may be supporting the stationary manner with respect to encoder track 30 and object 22. In other embodiments, as indicated by broken lines 47, object 22 may alternatively be physically coupled and connected to sensor 32. In such an embodiment from actuator 24 moves object 22 and sensor 32 relative to track 30. In such an embodiment, track 30 may be stationary. Although track 30 is illustrated as being linear, track 30 may alternatively be circumferential or arcuate such as when track 30 is provided on an encoder disc or wheel.

Output generator 34 comprises a device configured to receive sensed edge signals 44, 46 from both channels 40, 42 of sensor 32 and to operate in one of two modes: (1) an interpolation or synthesizing mode 50 or (2) a pass-through mode 52. In the interpolation mode, output generator 34 produces or synthesizes output signals 56 using less than all of the sensed edge signals received from sensor 32. Output generator 34 synthesizes such output signals 56 by interpolation, using only a portion of the received sensed edge signals for carrying out the interpolation. In the example illustrated, output generator 34 performs interpolation using a single type of edge from a single channel 40, 42 of sensor 32. The remaining sensed edges are not used in the interpolation. For example, in one embodiment, output generator 34 may interpolate using the sensed edge signals 44 from channel 40 that correspond to transitioning of leading edges 36. Sensed edge signals 44 which correspond to transitioning of trailing edges 36 are not used. The sensed edge signals 46 from channel 42 corresponding to either the leading edge or the trailing edge are not used. In other embodiments, output generator 34 may alternatively perform such interpolation using sensed edge signals 44 from channel 40 corresponding to the trailing edge, sensed edge signals from channel 42 corresponding to the leading edge or sensed edge signals and 46 from channel 42 corresponding to the trailing edge.

Because output generator 34 outputs signals 56 in the interpolation mode 50 using less than all of the received sensed edge signals from channels 40 and 42 of sensor 32, the output signals 56 may be more accurate. In particular, because output generator 34 outputs signals 56 based on sensed edge signals 44, 46 from a single channel 40, 42, output generator 34 reduces or eliminates channel phase errors. Channel phase errors may result from manufacturing variations or tolerances associated with the relative positioning of the sensing or detection elements of channels 40 and 42. For example, channels 40 and 42 may not be exactly 90 degrees out of phase with respect to one another due to manufacturing variations.

Because output generator 34 outputs signals 56 based upon sensed edge signals 44, 46 that correspond to movement or transitioning of a single type of edge, a leading edge or a trailing edge, output generator 34 reduces or eliminates duty cycle errors. Duty cycle errors may be the result of variations between spacing of marks 35. Duty cycle errors may also be the result of variations between the light emitting elements or variability over the life of such light emitting elements and the sensing thresholds of detecting elements.

Because output generator 34 synthesizes new replacement output signals 56 corresponding to the three sensed edge signals that were received, but which were discarded or not used, output generator 34 produces at least same number of output signals 56 as the number of sensed edge signals received from sensor 32. As a result, output generator 34 maintains the same level of resolution. In the example embodiment illustrated, output generator 34 synthesizes the replacement signals 56 using interpolation. In other embodiments, the replacement signals may be synthesized in other manners.

In the embodiment illustrated, output generator 34 interpolates by the same factor as the number of received sensed edge signals. In the example illustrated, output generator 34 receives four sensed edge signals—a leading edge and a trailing edge sensed edge signal from each of channels 40 and 42. As a result, output generator 34 interpolates with a factor of four. For example, in one embodiment, upon receiving a sensed edge signal from channel 40 corresponding to transitioning of a leading edge, output generator 34 determines an amount of time that has elapsed since previous receipt of a sensed edge signal from channel 40 also corresponding to transitioning of the leading edge. Output generator 34 divides this elapsed time value by the interpolation factor, four, to determine the interpolated time period. Thereafter, in addition to outputting a signal 56 corresponding to the sensed edge signal 44 from channel 40 corresponding to transitioning of the leading edge, output generator 34 also generates the next successive three interpolated output signals 56. This process is repeated upon receipt of the next sensed edge signal 44 corresponding to the transitioning of the leading edge and continues until output generator switches to pass-through mode 52.

In the pass-through mode, output generator 34 outputs signals 56 which correspond to each of the sensed edge signals 44 and 46 from both channels 40 and 42, respectively. In one embodiment, output generator 34 transmits the received sensed output signals and outputs such signals as output signals 56 without modifying such signals. In another embodiment, output generator 34 may slightly modify such signals before their respective output as signals 56.

In the embodiment illustrated, output generator 34 automatically changes between output mode 50 and output mode 52 based upon and in response to at least one of the sensed edge signals 44 and 46 received from sensor 32. According a one embodiment, output generator 34 automatically switches between output mode 50 and output mode 52 based upon sensed edge signals from at least one of channels 40 and 42 indicating movement at a minimum velocity. According to one embodiment, output generator 34 automatically changes from pass-through mode 52 to interpolation mode 50 in response to the received sensed edge signals indicating movement at having a minimum velocity and automatically changes from the interpolation mode 50 to the pass-through mode 52 in response to the sensed edge signals indicating velocity less than the minimum velocity threshold. In yet another embodiment, changing from the pass-through mode 52 to the interpolation mode 50 automatically occurs when the sensed edge signals 44 and/or 46 indicate a velocity exceeding a minimum velocity threshold for a predetermined minimum period of time or a predetermined distance (linear or angular). In some embodiments, changing from the pass-through mode 52 to the interpolation mode 50 may not occur unless the sensed edge signals 44 and 46 indicate consistent movement in a single direction for a predetermined minimum time and at or above a predetermined minimum velocity threshold. In one embodiment, the minimum velocity threshold may comprise multiple thresholds, wherein output generator 34 uses hysteresis or a hysterisis circuit in determining whether to change between modes 50 and 52.

In one embodiment, output generator 34 is configured to glitchlessly switch or change between the interpolation mode 50 and the pass-through mode 52. In other words, output generator 34 changes between modes 50 and 52 without introducing errors into the stream of output signals 56 transmitted to controller 26. Such errors may be caused by output generator 34 otherwise outputting a number of output signals 56 which does not equal a number of received sensed edge signals from sensor 32. Output generator 34 achieves such glitchless transitions by outputting a signal 56 corresponding to a sensed edge signal that corresponds to the one edge of the one channel that is designated for use in interpolation mode 50 (the designated sensed edge signal) regardless of whether output generator 34 is in the interpolation mode 50 or in the pass-through mode 52, wherein output generator 34 makes the determination of whether to execute a mode change after receipt of the designated sensed edge signal and prior to outputting the next signal 56 which may be either a successive sensed edge signal or synthesized or interpolated signal.

Because output generator 34 glitchlessly changes between modes 50 and 52, errors are not introduced into the stream of output signals 56 as a result of the switching. Because output generator 34 is able to operate in the interpolation mode 50 when certain velocities are attained, errors such as channel phase errors and duty cycle errors may be reduced or eliminated for an enhanced positional accuracy. At the same time, because output generator 34 is also able to operate in the pass-through mode 52 at relatively low speeds where hardware limitations would otherwise prevent interpolation mode 50 from being performed, output generator 34 may continue to output signals 56 to controller 26 such that controller 26 may maintain positional control of object 22.

According a one embodiment, output generator 34 may be embodied as one or more processing units and associated memories. Such processing units may be provided in a electronic device separate from controller 26. In other embodiments, such processing units may be incorporated as part of a single electronic device along with controller 26. In some embodiment, the processing unit of controller 26 may perform and carry out the logic of output generator 34 following hardwired instructions (such as an ASIC), computer readable instructions contained in a computer readable medium or combinations thereof. In one embodiment, the logic of output generator 34 may be embodied on a computer readable medium and may comprise instructions for directing one or more processing units to carry out such logic.

Figure 2:
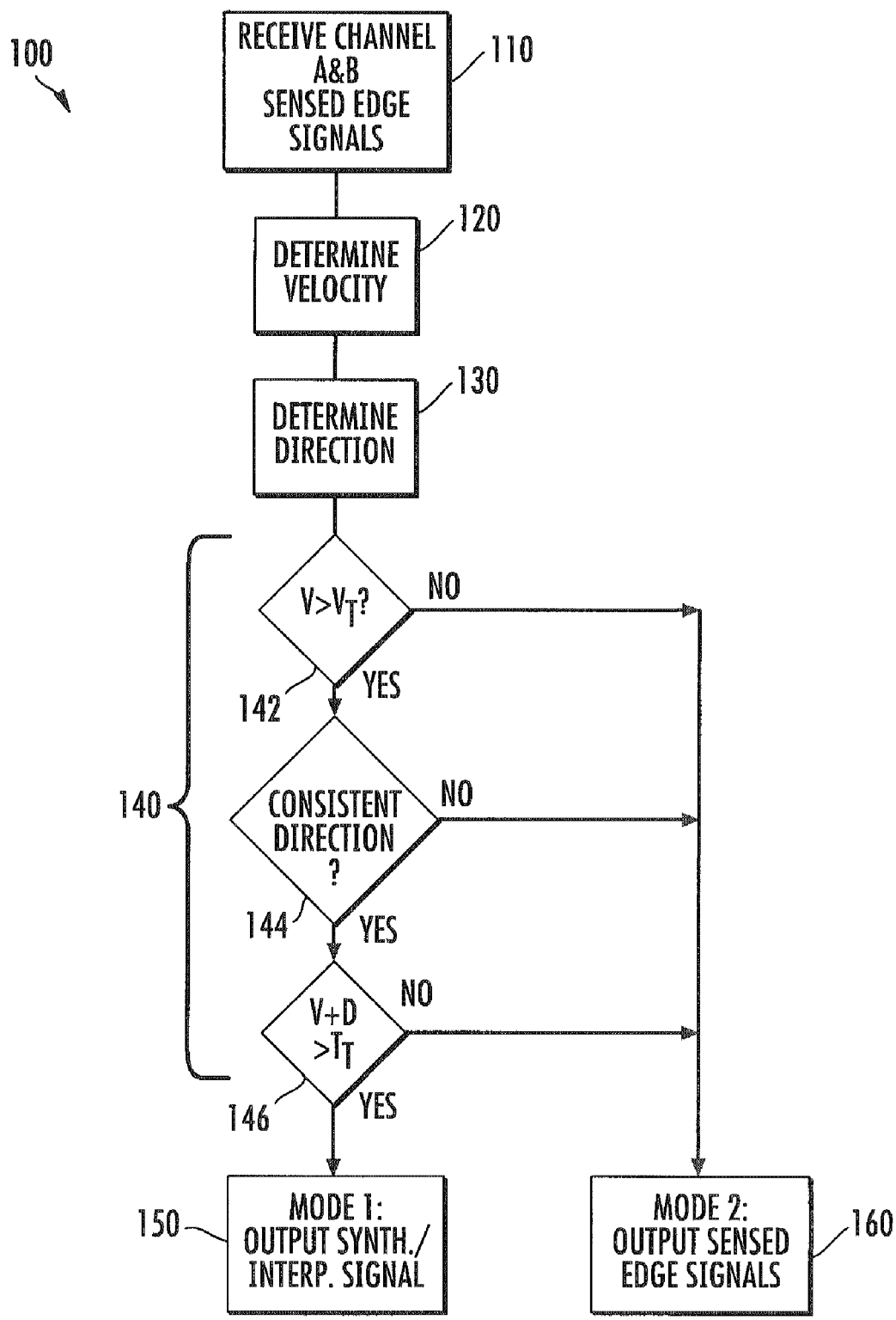
FIG. 2 is a flow diagram of an example method for the control system of FIG. 1 according to an example embodiment.

FIG. 2 is a flow diagram illustrating one example process or method 100 that output generator 34 may use to switch between interpolation mode 50 and the pass-through mode 52. As indicated by step 110, output generator 34 receives sensed edge signals 44 and 46 from channels 40 and 42 (channel A and channel B of a quadrature encoder), respectively. In particular, output generator 34 receives both leading and trailing edge signals from channel 40 and both leading and trailing edge signals from channel 42.

As indicated by step 120, output generator 34 uses such sensed edge signals to determine a velocity of object 22. In one embodiment, output generator 34 may determine the velocity using the elapsed time between consecutive edge signals from a single channel 40, 42 and from a single type of edge (leading edge or trailing edge). In another embodiment, output generator 34 may determine the velocity of object 22 using multiple received sensed step or edge signals from different channels or multiple types of edge signals. Output generator 34 may also determine a duration of time during which object 22 has maintained a particular velocity.

As indicated by step 130, output generator 34 also determines the direction in which object 22 is moving at the determined velocity. To make this determination, output generator 34 utilizes at least one type of sensed edge signal from each of channels 40 and 42.

As indicated by steps 140, output generator 34 compares the determined velocity and the determined direction to predetermined or preestablished criteria for making a determination of whether output generator 34 should be in output mode 50 or output mode 52. In step 142, output generator 34 evaluates whether the velocity determined in step 120 is sufficiently large so as to exceed one or more velocity thresholds for output generator 34 to operate in the interpolation mode 50. In one embodiment, the velocity threshold may be a velocity at which object 22 is moving at a known and constant rate such that interpolation would produce output signals 56 that are accurate. In another embodiment, the velocity threshold may be a velocity at which interpolation circuitry accurately functions, wherein the interpolation circuitry does not function at velocities below the noted velocity threshold. In other embodiments, the one or more velocity thresholds may be based on other factors.

Figure 3:
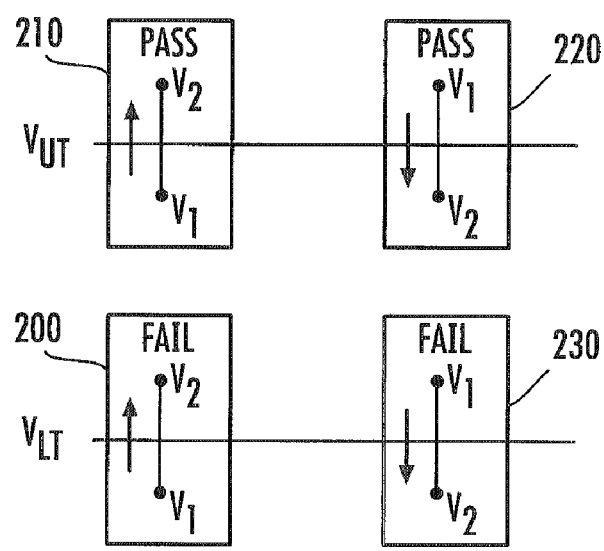
FIG. 3 is a diagram illustrating application of velocity criteria by an encoder output generator of the control system of FIG. 1 according to an example embodiment.

According to one embodiment, output generator 34 may evaluate the determined velocity using hysteresis. In other words, in determining whether to stay in or change to output mode 50 in which interpolation is performed, output generator 34 may additionally take into account previously determined velocities of object 22 or whether the determined velocity is accelerating or decelerating with respect to the one or more velocity thresholds. FIG. 3 is a diagram illustrating the application of a velocity criteria, including a lower velocity threshold $V_{LT}$ and an upper velocity threshold $V_{UT}$, to various circumstances. FIG. 3 further illustrates two consecutively determined velocities for object 22: $V_1$ and $V_2$. $V_2$ represent the most recent velocity determined from one or more sensed edge signals while $V_1$ represents the most recent velocity determined for object 22 by output generator 34 that precedes the time of velocity $V_2$ in time and that is on an opposite side of at least one of thresholds $V_{LT}$ and $V_{UT}$ as compared to velocity $V_2$.

FIG. 3 illustrates application of the velocity criteria, wherein output generator 34 applies logic such that once the determined velocity $V_2$ has exceeded the upper velocity threshold $V_{UT}$, output generator 34 may be maintained in output mode 50 so long as the determined velocity $V_2$ does not fall below the lower velocity threshold $V_{LT}$. Once the determine velocity $V_2$ falls below the lower velocity threshold, the determined velocity must once again exceed the upper velocity threshold in order for output generator 34 to change back to the interpolation mode 50. Application of such multiple velocity thresholds enables output generator 34 to remain in a more accurate interpolation mode 50 despite temporary drops in the velocity from above to below the upper velocity threshold which may be the result of jitter, vibration and the like. Such a criteria reduces likelihood of output generator 34 constantly, repeatedly and unnecessarily changing between different output modes.

As shown by FIG. 3, circumstance 200 depicts a time when the velocity of object 22 has accelerated from below to above the lower velocity threshold $V_{LT}$. This circumstance does not satisfy the applied velocity criteria. Circumstance 210 depicts a time when the determined velocity of object 22 has continued to accelerate from below to above the upper velocity threshold $V_{UT}$. Because the current velocity $V_2$ exceeds the upper velocity threshold $V_{UT}$, the determined velocity satisfies the velocity criteria. Circumstance 220 depicts a time when the velocity of the object has decelerated from above to below the upper velocity threshold $V_{UT}$ but remains above the lower velocity threshold $V_{LT}$. In this circumstance, the logic of output generator 34 is such that the determine velocity $V_2$ still satisfies the velocity criteria. Lastly, circumstance 230 depicts a time when the determined velocity $V_2$ has decelerated from above to below the lower velocity threshold $V_{LT}$. In this circumstance, the logic of output generator 34 is such that the determined the velocity $V_2$ does not satisfy the velocity criteria.

As indicated by step 144, if output generator 34 determines that the velocity criteria has been satisfied, output generator 34 further determines whether object 22 is consistently moving in a single direction. In particular, output generator 34 uses sensed edge signals from both channels 40 and 42 to determine the direction in which object 22 is moving and to also determine for how long object 22 has been moving in the direction. In such a manner, output generator 34 may determine whether object 22 is simply vibrating or jittering back-and-forth at potentially high velocities for relatively short period of time or whether object 22 is consistently moving at a sufficiently high velocity in a single constant direction. If output generator 34 determines that object 22 is moving in a single direction for a sufficient period of time, the criteria and output generator 34 proceeds by applying the criteria set forth in step 146.

As indicated in step 146, output generator 34 (shown in FIG. 2) determines, based upon the receive sensed edge signals 44, 46, whether object 22 has been moving at a sufficient velocity in a consistent direction for a sufficient period of time so as to exceed a minimum time threshold $T_T$. As indicated by step 150, if each of the criteria in steps or 142, 144 and 146 are satisfied, output generator 34 either remains in interpolation output mode 50 or changes to interpolation output mode 50. Alternatively, as indicated by step 160, if any of the criteria set forth in steps 142, 144 and 146 are not satisfied, output generator 34 either stays in the pass-through mode 52 or changes to the pass-through mode 52. In one embodiment, such a change occurs after the designated sensed edge signal has been output and prior to output of another signal 56.

Although method 100 has been illustrated as applying each of the criteria set forth in steps 142, 144 and 146, in other embodiments, greater or fewer such criteria may be applied or other criteria may be applied for determining whether to operate in either the interpolation mode 50 or the pass-through mode 52. Although the steps of method 100 are illustrated in the noted order, in other embodiments, such steps may have alternative orders. For example, step 130 may alternatively be performed after step 142. In such an alternative embodiment, if the current determined velocity fails to satisfy the velocity threshold criteria of the step 142, output generator 34 would not carry out the process of determining the direction per step 130. Although method 100 illustrates its steps as being performed in sequential order, in other embodiments, such individual steps may be performed concurrently or in parallel.

Figure 4:
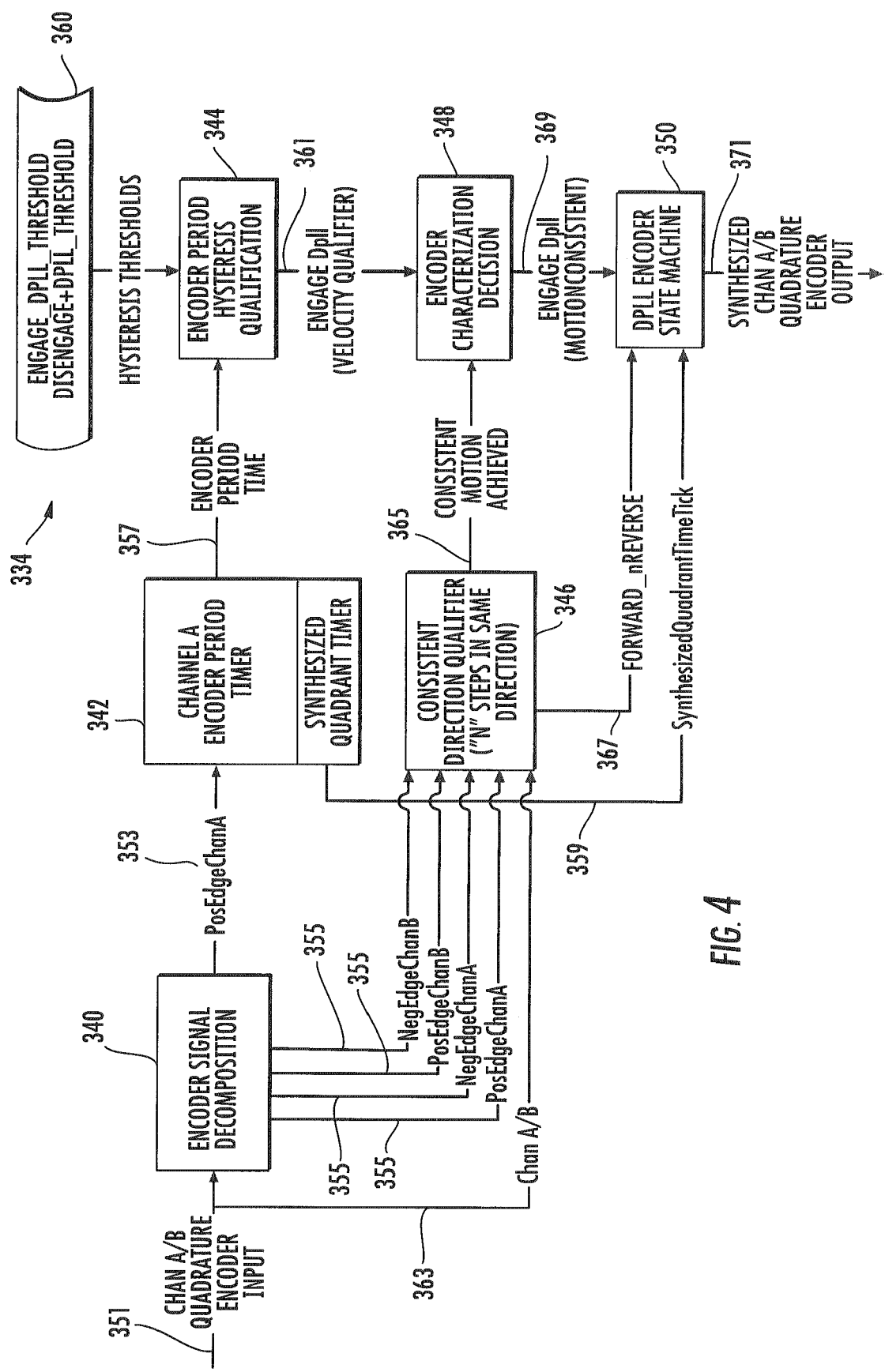
FIG. 4 is a block diagram schematically illustrating another embodiment of the encoder output generator of the control system of FIG. 1 according to an example embodiment.

FIG. 4 is a functional block diagram illustrating output generator 334, a particular embodiment of output generator 34. Output generator 334 includes one or more logic or electronic components configured to perform the steps shown in the illustrated functional blocks. Alternatively, such steps may be programmed onto a computer readable medium. As shown by FIG. 4, output generator 334 includes encoder signal decomposition logic 340, encoder period timer 342, hysteresis qualification logic 344, direction qualifier logic 346, encoder characterization decision logic 348 and encoder state machine 350. Encoder signal decomposition logic 340 receives quadrature encoder sensed edge signals 351 from both channels of a quadrature encoder and decomposes such sensed edge signals to determine to what edges and from what channels they correspond. Encoder signal decomposition logic 340 passes sensed edge signals 353 corresponding to a single type of edge from a single channel (designated interpolation sensed edges) to encoder period timer 342. In the example illustrated, logic 340 passes sensed edge signals 353 corresponding to transitioning of a positive or leading edge as sensed by channel A. As further shown by FIG. 4, encoder signal decomposition logic 340 passes sensed edge signals 355 for each type of edge from each of channels A and B to direction qualifier logic 346.

Encoder period timer 342 comprises logic or an electronic component configured to measure or count the elapsed time between the receipt of the consecutive designated sensed edge signals 353. The elapsed time period corresponds to a determined velocity of the object being sensed. For purposes of this disclosure, the term "velocity" shall mean any value corresponding to the rate at which the object being sensed or tracked, such as object 22, is moving. A "velocity" may be represented by a velocity value or its inverse, a time period value. As shown by FIG. 4, timer 342 transmits one or more signals 357 representing the determined velocity of the sensed object to hysteresis qualification logic 244.

As further shown by FIG. 4, timer 342 is additionally configured to serve as a synthesized quadrants timer. In other words, timer 342 is configured to synthesize signals based upon the received designated sensed edge signals 353 from logic 340. In the example illustrated, timer 342 is configured to interpolate based upon the measured or counted amount of time that has elapsed between consecutive designated sensed edge signals 353 from logic 340. In the example illustrated, timer 342 uses an interpolation factor of four, dividing the elapsed time by four to determine the interpolated time period. Timer 342 transmits synthesized quadrants timer ticks or signals 359 representing the sensed edge signal 353 from channel logic 340 corresponding to transitioning of the leading edge of channel A and the next successive three interpolated edge signals, spaced by the interpolated time period, to encoder state machine 350.

Hysteresis qualification logic 344 comprises logic or one or more electronic components configured to compare the determined velocity (encoder period time) against one or more velocity criteria or thresholds as programmed into or stored in memory 360, which may comprise a register. In the embodiment illustrated, memory 360 includes an upper velocity threshold and a lower velocity threshold. Application of the upper velocity threshold and the lower velocity threshold is described above with respect to FIG. 3. If the velocity value (encoder period time) satisfies the velocity criteria logic 344 transmits one or more signals 361 to logic 348 indicating satisfaction of the velocity criteria ("engage Dpll"). In other embodiments, logic 344 may apply other velocity criteria.

In addition to evaluating a velocity of the object being sensed, output generator 334 further evaluates a direction in which the object is moving. Consistent direction qualifier logic 346 receives sensed edge signals 355 from decomposition logic 340 corresponding to both positive (leading) edges and negative (trailing) edges from both channels A and B. Logic 346 further receives as input a stream of the sensed edge signals 363 directly from the quadrature encoder. Logic 346 evaluates the sensed edge signals to determine the direction in which the object 22 is moving and to also determine for how long the object is moving in a consistent direction. Based on this determination, logic 346 transmits a signal 365 indicating whether or not object 22 is moving in a consistent direction or exhibiting consistent motion. As shown by FIG. 4, direction qualifier logic 346 further transmits signals 367 corresponding to signals 355 to encoder state machine 350.

Encoder characterization decision logic 348 comprises logic or one or more electronic components configured to receive signals 361 and 365 indicating both the velocity and the direction of travel of object 22. Logic 348 is configured to compare or evaluate such information against a time criteria to determine whether the object has been moving at a minimum velocity in a consistent direction for a minimum period of time. If this criteria is met, logic 348 transmits one or more signals 369 to state machine 350 indicating satisfaction of all of the criteria for output generator 334 operating in an interpolation mode for outputting interpolated signals. In other embodiments, signal 369 may alternatively indicate a failure to satisfy all of the criteria for operating in an interpolation mode (satisfaction of all the criteria for operating in the pass-through mode).

Encoder state machine 350 comprises logic or one or more electronic components configured to switch between either an interpolation mode or a pass-through mode depending upon signal 369. In response to signal 369 indicating that each of the criteria has been satisfied for operating in the interpolation mode, machine 350 outputs signals 371 corresponding to signals 359 originating at timer 342. Alternatively, in response to not receiving signal 369 or in response to signal 369 indicating that each of the criteria for operating in the interpolation mode have not been satisfied, state machine 350 outputs signals 371 which correspond to signals 367 which further correspond to signals 355, the sensed edge signals.

Figure 5:
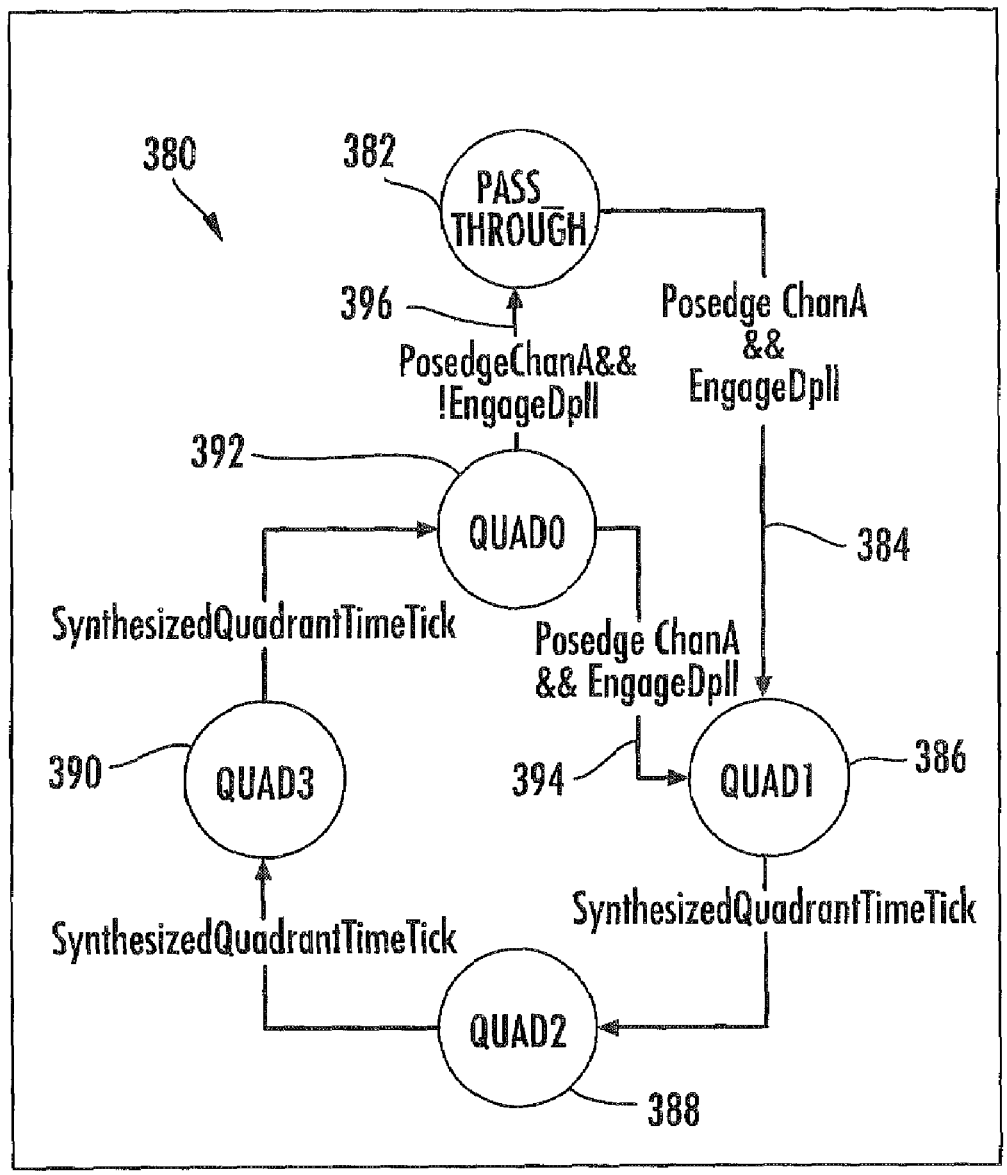
FIG. 5 is a state diagram of an encoder state machine of the encoder output generator of Figure numeral for according to an example embodiment.

FIG. 5 is a state diagram 380 for encoder state machine 350. At node 382, encoder state machine 350 is in the pass-through mode in which state machine 350 is outputting signals 371 (shown in FIG. 4) corresponding to each of the sensed edge signals 355 from the quadrature encoder (the "raw" encoder data).

As indicated by arrow 384, in response to receiving one or more signals 369 from decision logic 348 indicating that all of the criteria or qualifications for output generator 334 operating in the interpolation mode have been met ("Engage Dpll), state machine 350 switches output generator 334 to the interpolation mode. As indicated in arrow 384 and represented by node 386 (Quad 1), state machine 350 outputs a signal 371 corresponding to sensed edge signal 353. As noted above, sensed edge signal 353 corresponds to the transitioning of a single edge from a single channel of the encoder designated for interpolation. In the example illustrated, sensed edge signal 353 corresponds in time to transitioning of the positive edge of channel A. As indicated at nodes 388, 390 and 392, state machine 350 continues by outputting signals 371 corresponding in time to the synthesized or interpolated time ticks or signals 359 received from timer 342. Each node 388 (Quad 2), 390 (Quad 3) and 392 (Quad 0) represents a synthesized quadrant time tick replacing a corresponding one of sensed edges 355.

After outputting the last of the synthesized time ticks or signals, state machine 350 determines whether to stay in the interpolation mode or to switch to be passed through mode depending upon signal 369. As indicated by arrow 394, if signal 369 continues to indicate that all of the criteria or qualifications for operating in the interpolation mode remain satisfied, state machine 350 remains in the interpolation mode by once again outputting signals 371 corresponding to the interpolated or synthesized quadrant time ticks or signals 359. Following output of a signal 371 corresponding in time to the sensed edge signal 353, state machine 350 outputs three signals that are spaced by the interpolated time period.

Alternatively, as indicated by arrow 396, if state machine 350 does not receive the signal 369 or receives a signal 369 indicating that all of the criteria or qualifications for operating in the interpolation mode have not been met ("!Engage Dpll"), state machine 350 outputs signals 371 corresponding in time to the designated sensed edge signal 353 ("PosedgeChan A") and switches to the pass-through mode as indicated at node 382. Thereafter, state machine 350 outputs signals 371 corresponding to sensed edge signals 355 until receiving a signal 369 indicating that the qualifications for operating in the interpolation mode are once again met as indicated at arrow 384. For example, after outputting a signal 371 corresponding to sensed edge signal 353 (PosEdgeChanA), state machine 350 will next pass through sensed edge signals including and corresponding to transitioning of the negative edge of channel A, the positive edge of channel B and the negative edge of channel B.

Overall, state machine 350 provides glitchless switching between the interpolation mode and the pass-through mode. In other words, state machine 350 changes between the interpolation and pass-through modes without introducing errors into the stream of output signals 371. Such errors may be caused by output generator 334 otherwise outputting a number of output signals 371 which does not equal a number of received sensed edge signals 355 from the quadrature encoder. Output generator 334 achieves such glitchless transitions by outputting a signal 371 corresponding to a sensed edge signal 353 that corresponds to the one edge of the one channel that is designated for use in interpolation mode (the designated sensed edge signal) regardless of whether output generator 334 is in the interpolation mode or in the pass-through mode, wherein output generator 334 makes the determination of whether to execute a mode change after receipt of the designated sensed edge signal and prior to outputting the next signal 371 which may be either a successive sensed edge signal or synthesized or interpolated signal.

Figure 6:
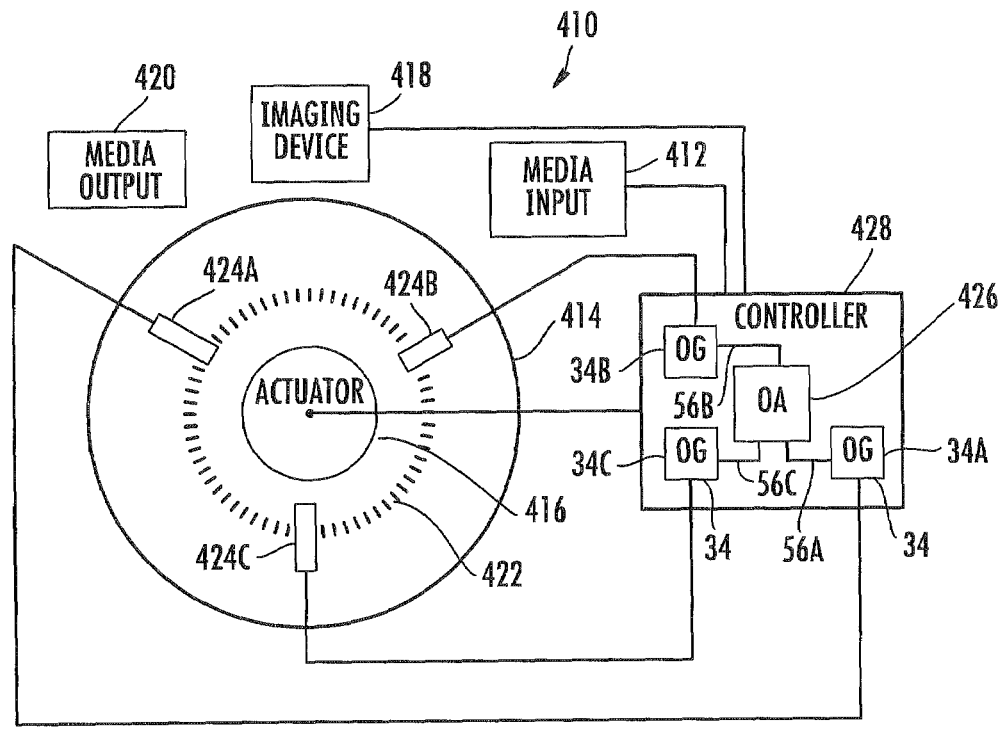
FIG. 6 is a schematic illustration of an imaging apparatus including the output generators of FIG. 1 according to an example embodiment.

FIG. 6 schematically illustrates encoder output generators 34A, 34B, 34C (collectively referred to as output generators 34) employed as part of an imaging apparatus 410, wherein an output generator 34 is provided for each encoder sensor 424 of imaging apparatus 410. In addition to output generators 34, imaging apparatus 410 includes media input 412, media support 414, actuator 416, imaging device 418, media output 420, encoder track 422, sensors 424A, 424B and 424C (collectively referred to as sensors 424), output averager 426 and controller 428. Media input 412 (schematically shown) may comprise a mechanism configured to supply and transfer sheets of media to support 414 of apparatus 410. In one embodiment, media input 108 may include a media storage volume, such as a tray, bin and the like, one or more pick devices (not shown) configured to pick a sheet of media from the storage volume and one or more media transfer mechanisms configured to transfer the media to support 414. Media input 108 may have a variety of sizes and configurations.

Media support 414 comprises one or more surfaces configured to support media to be printed upon opposite to imaging device 418. In particular embodiments, media support 414 is further configured to transport media from media input 412 to imaging device 418 and from imaging device 418 to media output 420. In the example illustrated, media support 414 comprises a cylinder or drum.

Actuator 416 comprise a device configured to move media support 414 relative to imaging device 418 so as to transport media relative to imaging device 418. In the example illustrated, actuator 416 comprises a rotary actuator, such as a motor, coupled to media support 414 which comprises a drum.

Imaging device 418 (schematically shown) comprises a mechanism or device configured to print or otherwise form an image upon sheets of media held by support 414. In one embodiment, imaging device 418 may be configured to eject fluid ink onto sheets of media held by support 414. In one embodiment, imaging device 418 may include one or more print heads carried by a carriage that are configured to be scanned across sheets of media held by support 414 in directions generally along a rotational axis of support 414. In other embodiments, imaging device 418 may include print heads which substantially extend across a width or a dimension of sheets of media held by support 414 such as with a page-array printer. In still other embodiments, imaging device 418 may comprise other printing devices configured to deposit ink, toner or other printing material upon sheets of media held by support 414 in other fashions.

Media output 420 comprises a mechanism or device configured to transport sheets of media to one or more locations for further interaction or for output to a user of printing apparatus 410. For example, in one embodiment, media output 420 may be configured to transport such ejection sheets of media to a duplexer and back to media input 412 for two-sided printing. In still another embodiment, media output 420 may be configured to transport such ejected sheets to an output tray or bin for receipt by a user of imaging apparatus 410.

Encoder track 422 is similar to encoder track 30 in that in encoder track 422 includes a multitude of increment marks having input edges equidistantly spaced from one another and configured to be sensed by sensors 424. Track 422 is coupled to media support 414 so as to move relative to sensors 424.

Sensors 424 comprise devices configured to sense the passing of the input edges of track 422 to relative movement between track 422 and sensors 424. In one embodiment, sensors 424 are additionally configured to detect a direction in which track 422 and sensors 424 are moving relative to one another. In the example illustrated, sensors 424 comprise quadrature encoder modules having two channels. Each quadrature encoder module includes a low pass filter (LPF) and illegal state correction.

As shown by FIG. 6, sensors 424 include at least two sensors 424A and 424B. As a result, output averager 426 may detect and correct for first order errors such as eccentricity. In particular embodiments, apparatus 410 may include additional encoder modules or sensors 424C to 424N. Such additional sensors may enable output averager 426 to correct for higher order errors such as ovoidness.

Output averager 426 addresses errors of encoder track 422 or the mounting of encoder track 422, such as eccentricity or ovoidness, by outputting an increment completion signal using a weighted centroid of the time at which the edge signals from output generators 34 are received. In particular, output averager 426, using one or more counters or timers, keeps track of elapsed time from the receipt of a first output signal to the receipt of each subsequently received output signal from output generators 34. Using one or more integrated circuit components or one or more processors, output averager 426 determines an average of such times and outputs the increment completion signal based upon the TWC. However, because the TWC calculation cannot be completed until after receipt of the final Nth output signal (where N equals the number of sensors 424), which occurs after an ideal time, output averager 426 outputs the increment completion signal a predetermined constant time offset after the TWC. Because the increment completion signal is output at a constant time offset after the TWC (which is equal to the ideal time or the actual time at which the rotatable object has rotated a distance equal to one increment of encoder track 422), this added constant time offset may be accounted for when subsequently using the increment completion signal to determine positioning or movement of the rotatable object to which encoder track 422 is coupled. According to one embodiment, the time constant is greater than twice the time it takes for the movable object to travel one increment and less than four times the same time.

Figure 7:
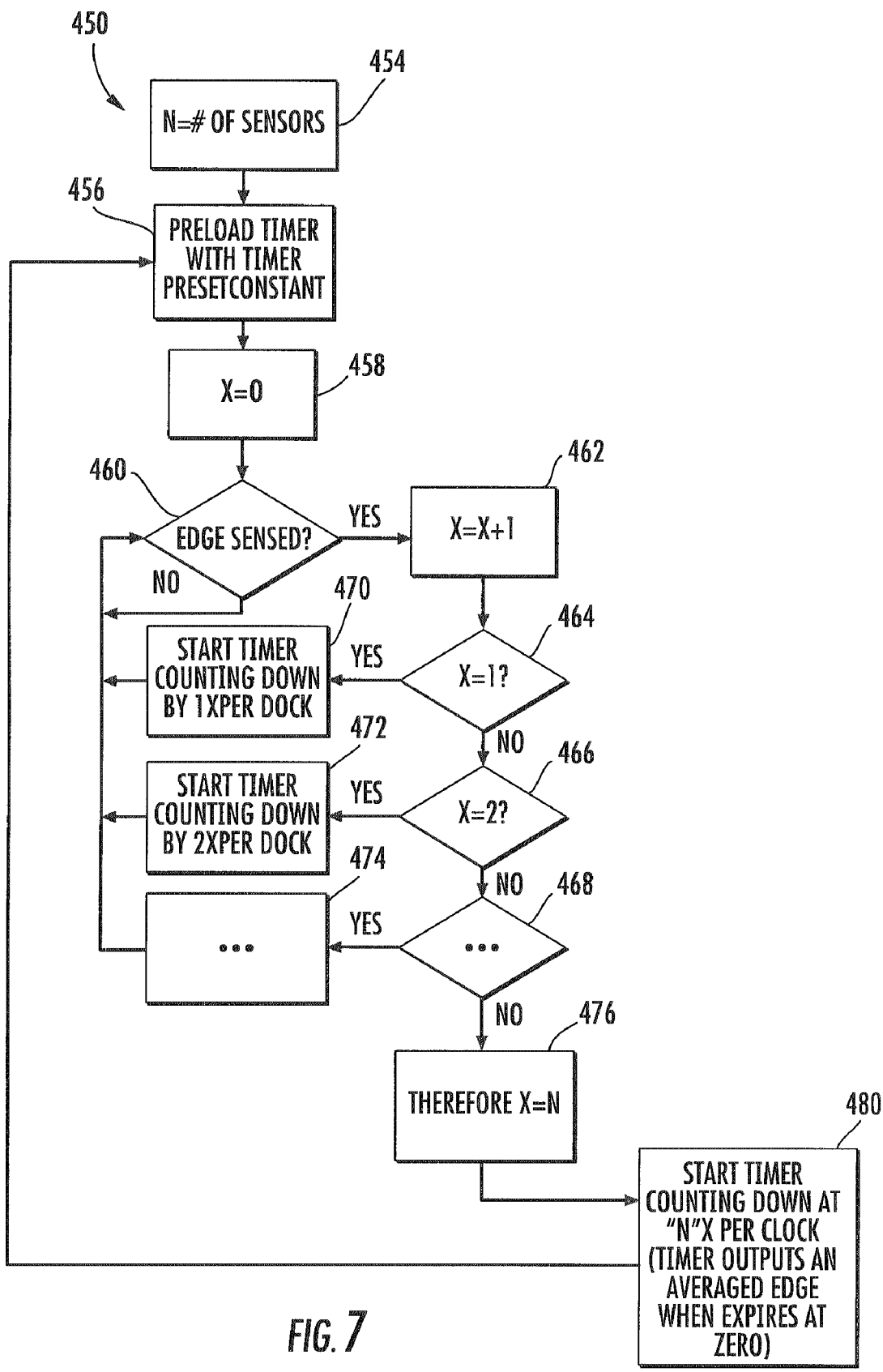
FIG. 7 is a flow diagram illustrating a method of an output averager of the imaging apparatus of FIG. 6 according to an example embodiment.

FIG. 7 is a flow diagram of one method 450 may be used by output averager 426 to determine a TWC and to output an increment completion signal. Method 450 facilitates the calculation of a TWC and the output of the increment completion signal by output averager 426 without a processor and with ASIC components. As indicated by step 454, the variable N is set so as to be equal to the number of sensors 424 along track 422. As indicated by step 456, the timer is set or preloaded with an initial timer preset constant. The timer is a preloaded "down" counter that generates an increment completion signal upon expiring at zero and saturates at zero until preloaded again. As indicated by step 458, the variable x, representing a count of the edges that have been sensed, is initially set to a value of zero. As indicated by step 460, upon sensing of an edge (the receipt of an edge signal by output averager 426), output averager 426 increases the value of x by one as indicated by step 462. As indicated by steps 464, 466 and 468, output averager 426 determines that value of x. As indicated by steps 470, 472 and 474, output averager 426 counts down the timer at a rate that is a multiple of x. For example, after the first edge is sensed, the timer will be counted down at a rate R, after the second edge is sensed, the timer will be counted down at a rate 2R and so on until the final edge is sensed. As indicated by step 476, if the variable x is equal to the variable N, indicating that the last edge (the Nth edge of an encoder system including N sensors) has been sensed. Thereafter, as indicated by step 480, the timer is counted down further at the rate NR until the timer reaches zero or is exhausted. For example, if encoder system includes three sensors, the timer will be counted down at a rate 3R until the timer value is equal to zero. As indicated by step 480, upon the timer counting down to zero, output averager 426 outputs the increment completion signal. Thereafter, method 450 is once again repeated by output averager 426, beginning at step 456, to once again identify when the object has rotated another increment.

Controller 428 comprises one or more processing units configured to generate control signals directing the operation of rotary actuator 416, media input 412, imaging device 418 and media output 420. As shown by FIG. 9, controller 428 incorporates output averager 426.

Output generators 34 are described above with respect to FIGS. 1 and 2. In one embodiment, each output generator 34 may specifically comprise output generator 334 described above with respect to FIGS. 4 and 5. Output generators 34 are interposed between sensors 424 and output averager 426. Although output generators 34 and output averager 426 are illustrated as being integrated with controller 428, in other embodiments, output generators and/or output averager 426 may be separate modules or may be integrated with other electronic devices. For example, in another embodiment, each output generator may alternatively be integrated with its associated sensor 424.

As noted above, output generators 34A, 34B and 34C comprise devices configured to receive sensed edge signals from both channels of an associated sensor 424 and to output signals 56A, 56B and 56C, respectively. Such signals are received and averaged by output averager 426 to generate an increment signal that is used by controller 528 to control at least the positioning of media support 414. When used in conjunction with output averager 426, output generators 34 provide imaging system with enhanced positional control. As noted above, by operating in two modes: (1) an interpolation or synthesizing mode or (2) a pass-through mode, output generators reduce or eliminate errors associated with their respective sensors 424 such as duty cycle errors and channel phase errors while maintaining positional control at relatively lower velocities of media support 414. Because averager 426 averages the signals received from the multiple sensors 424 and their associated output generators 34, averager 426 reduces or eliminates errors associated with encoder track 422 or the mounting of encoder track 422, such as eccentricity or ovoidness.

In operation, controller 428 generates control signals directing actuator 416 to rotate media support 414. Controller for 22 further generate control signals directing media input 412 to supply print media to support 414. As a result, support 414 transports the supplied sheet of media to imaging device 418 which deposits printing material upon the sheet. In one embodiment, imaging device 418 deposits fluid droplets onto the sheet. In another embodiment, imaging device 418 electrostatically deposits toner or other printing material upon the sheet carried by media support 414. Once printing has been completed, the sheet is discharged to media output 420.

Imaging device 418 deposits printing material upon the sheet in response to control signals from controller 428. Controller 428 generates such control signals based upon a determined position of the sheet to be printed upon relative to imaging device 418. This position is determined by controller 428 using increment completion signals received from output averager 426 which are based upon signals output by output generators 34. Because output generators 34 and output averager 426 provides for more accurate output of increment completion signals, a more accurate determination of the position of media support 414 and the sheet of media held by media support 414 may be achieved. This may result in more accurate deposition of printing material upon the sheet for enhanced image quality.

Figure 8:
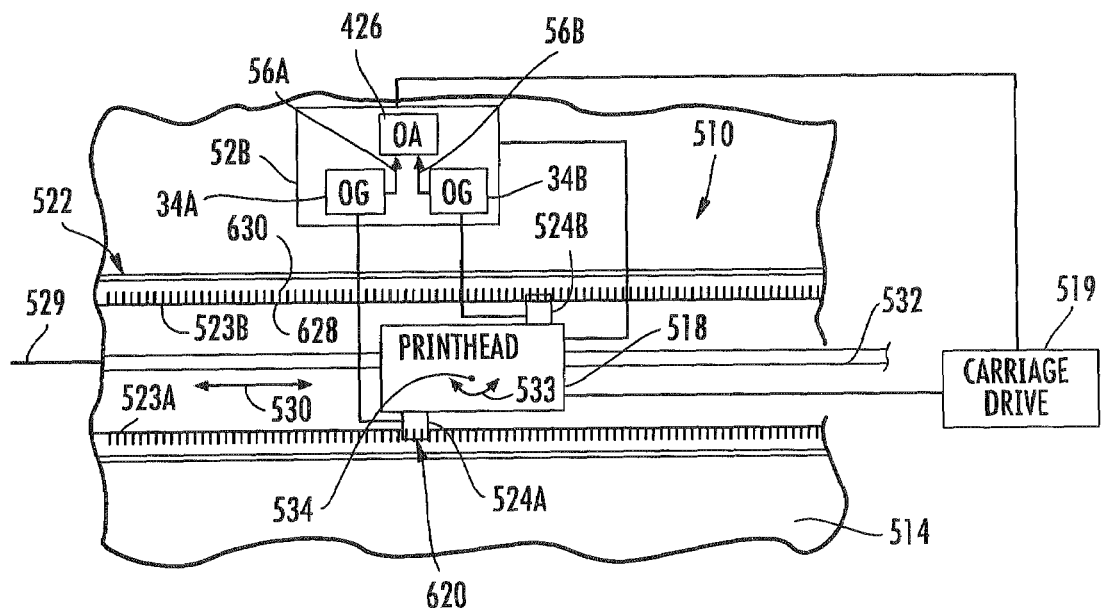
FIG. 8 is a schematic illustration of another embodiment of an imaging apparatus including the output generators of FIG. 1 according to an example embodiment.

FIG. 8 is a top plan view schematically illustrating imaging apparatus 510, another embodiment of imaging apparatus 410, incorporating output generators 34. In addition to output generators 34, apparatus 510 includes media support 514, print head 518, carriage drive 519, encoder track 522, sensors 524A and 524B (collectively referred to as sensors 524), output averager 426 (described above with respect to imaging apparatus 410), output and controller 528. Media support 514 comprises a surface extending opposite to print head 518 configured to support media during printing by print head 518. In one embodiment, media support 514 may comprise a platen, wherein media is moved by one or more belts, rollers or other structures in engagement with the media. In another embodiment, support 514 may itself comprise a roller or a belt.

Print head 518 comprises a device configured to scan or move along an axis 528 across a width of the media supported by support 514 is indicated by arrows 530. In the embodiment illustrated, print head 518 is movably supported and guided by one or more carriage rods 532 which extend along or parallel to axis 528. Carriage drive 519 comprises a device or mechanism coupled to print head 518 so as to move print head 518 along axis 528 as guided by rod 532. In other embodiments, print head 518 may be moved along axis 528 in other fashions.

Encoder track 522 includes track portions 523A and 523B (collectively referred to as track portions 523). Track portions 523 each comprise elongate linear structures extending parallel to or along axis 528 on opposite sides of print head 518. Track portions 623 each include a multitude of marks 628 having edges 630 configured to be sensed by sensors 524.

Sensors 524 comprised devices configured to sense the passing or relative movement of edges 630. Sensors 524 are attached to opposite sides of print head 518 at opposite ends of print head 518 along axis 529. In the embodiment illustrated, sensors 524 comprise quadrature encoders.

Output averager 426 is incorporated as part of controller 522. In other embodiments, output averager 426 may be independent of controller 522 while supplying increment completion signals to controller 522. In one embodiment, output averager 426 operates according to method 450 shown and described with respect to FIG. 7. In other embodiments, output averager 426 may operate using other methods, wherein the increment completion signal is output a constant time offset following a determined TWC of edge signals received from sensors 524.

As indicated by arrows 533, during movement of print head 518 along axis 528, print head 518 may rotate or pivot about axis 534. This may cause edge signals from one of sensors 524 and associated output generator 34 to occur prior to the ideal time (the time in which movement of print head 518 a distance equal to an increment is actually completed) and edge signals from the other of sensors 524 and associated output generator 34 to occur after the ideal time. Because output averager 426 determines a TWC of the received edge signals and outputs the increment completion signal a predetermined constant offset from the TWC, output averager 426 may more accurately indicate the positioning of print head 518 along axis 528. As a result, printing performance may be enhanced.

Controller 522 comprises one or more processing units configured to generate control signals for directing operation of print head 518, carriage drive 519 and any mechanisms (not shown) for moving media relative to print head 518. As shown by FIG. 10, controller 522 incorporates output generators 34 and output averager 426. Controller 522 uses increment completion signals output by output averager 426 which is based on signals output from output generators 34 to generate control signals for directing the deposition of printing material upon media by print head 518.

Output generators 34 are described above with respect to FIGS. 1 and 2. In one embodiment, each output generator 34 may specifically comprise output generator 334 described above with respect to FIGS. 4 and 5. Output generators 34 are interposed between sensors 524 and output averager 426. Although output generators 34 and output averager 426 are illustrated as being integrated with controller 528, in other embodiments, output generators and/or output averager 426 may be separate modules or may be integrated with other electronic devices. For example, in another embodiment, each output generator may alternatively be integrated with its associated sensor 524.

As noted above, output generators 34A and 34B comprise devices configured to receive sensed edge signals from both channels of an associated sensor 424 and to output signals 56A and 56B respectively. Such signals are received and averaged by output averager 426 to generate an increment signal that is used by controller 528 to control at least the positioning of print head 58 using carriage drive 519. When used in conjunction with output averager 426, output generators 34 provide imaging system with enhanced positional control.

As noted above, by operating in two modes: (1) an interpolation or synthesizing mode or (2) a pass-through mode, output generators reduce or eliminate errors associated with their respective sensors 424 while maintaining positional control at relatively lower velocities of media support print head 518. Because averager 426 averages the signals received from the multiple sensors 424 and their associated output generators 34, averager 426 reduces or eliminates errors associated with encoder track 522 or the mounting of encoder track 522.

With each other imaging apparatus 410 and 510 described above, output generators 34 reduce errors that are associated with sensors 424 or 524. As a result, output averager 426 generates more accurate increment completion signals. Consequently, controllers 428 and 528 more accurately control positioning of either media support 414 or print head 518 as it is moved along axis 529. Although output generators 34 are illustrated as being used in conjunction with output averager 426, in other embodiments, output generators 34 may be employed in imaging systems without output averagers 426 and may be used in conjunction with other systems which use signals from output generator 34 to control positioning of media support 414 or print head 518. Although output generator 34 are illustrated as being employed in imaging apparatus 410 and 510, in other embodiments, output generator 34 may be employed in other systems where the positioning of an object is to be controlled.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. An apparatus comprising:
an output generator configured to output signals based at least in part upon sensed edge signals received from a quadrature encoder, the output generator being configured to operate in a first output mode in which output signals are based upon interpolation of sensed edge signals from a first channel of the quadrature encoder and a second output mode in which output signals are based upon sensed edge signals from the first channel and a second channel of the quadrature encoder.

2. The apparatus of claim 1, wherein the generator changes between the first output mode and the second output mode automatically in response to sensed edge signals from at least one of the first channel and the second channel.

3. The apparatus of claim 2, wherein the generator changes from the second output mode to the first output mode based upon sensed edge signals from the first channel and the second channel indicating movement in a first direction for a minimum period of time or a minimum extent and at a minimum velocity.

4. The apparatus of claim 1, wherein interpolation of the sensed edge signals in the first output mode is based on sensed edge signals that correspond to transitioning of a single edge of the first channel.

5. The apparatus of claim 1, wherein the generator is configured to change between the first output mode and the second output mode by applying a velocity hysteresis qualification.

6. The apparatus of claim 1, wherein the generator is configured to change between the first output mode and the second output mode using a lower velocity threshold and an upper velocity threshold, wherein the generator is configured to change from the second output mode to the first output mode in response to velocity of an object sensed by the quadrature encoder increasing from below to above the upper threshold and wherein the generator is configured to change from the first output mode to the second output mode in response to velocity of the object decreasing from above the lower threshold to below the lower threshold.

7. The apparatus of claim 1, wherein interpolation is by a factor of four.

8. The apparatus of claim 1, wherein the generator is configured to change between the first output mode and the second output mode while outputting a number of signals equal to a number of sensed edge signals received from the quadrature encoder.

9. The apparatus of claim 1, wherein the generator is configured to output an output signal corresponding to a sensed edge signal that corresponds to transitioning of a first edge of the first channel in each of the first output mode and a second output mode.

10. The apparatus of claim 9, wherein the generator is configured to output interpolated output signals based on elapsed time between two immediately prior consecutive sensed edge signals received from the quadrature encoder and corresponding to the first edge of the first channel until receipt of a new sensed edge signal corresponding to the first edge of the first channel when in the first output mode and wherein the generator is configured to make a determination as to whether to change from the first mode to the second mode upon receipt of the new sensed edge signal.

11. The apparatus of claim 10, wherein the generator is configured to output signals corresponding to sensed edge signals that correspond to transitioning of at least one edge of the first channel or the second channel distinct from the first edge upon switching from the first mode to the second mode.

12. The apparatus of claim 1 further comprising a printing device configured to print upon a medium based at least in part upon the output signals.

13. The apparatus of claim 12 further comprising an actuator configured to position one of the printing device and the medium based at least in part upon the output signals.

14. The apparatus of claim 1 further comprising the quadrature encoder.

15. An apparatus comprising:
means for interpolating sensed edge signals received from an encoder to form interpolated signals; and
output means for switching between a first mode in which sensed edge signals from the encoder are output and a second mode in which the interpolated signals are output.

16. A method comprising:
operating in a first output mode in which output signals are based upon interpolation of sensed edge signals from a first channel of a quadrature encoder; and
operating in a second output mode in which output signals are based upon sensed edge signals from the first channel and a second channel of the quadrature encoder.

17. The method of claim 16 further comprising automatically changing between the first output mode and the second output mode in response to sensed edge signals from at least one of the first channel and the second channel.

18. The method of claim 16 further comprising:
automatically changing from the second output mode to the first output mode in response to velocity of an object being sensed by the quadrature encoder increasing from below to above an upper threshold; and
automatically changing from the first output mode to the second output mode in response to velocity of the object decreasing from above a lower threshold to below a lower threshold.

19. The method of claim 16 further comprising outputting an output signal corresponding to a sensed edge signal that corresponds to transitioning of a first edge of the first channel in each of the first output mode and the second output mode.

20. The method of claim 16 further comprising:
outputting interpolated output signals based on elapsed time between two immediately prior consecutive sensed edge signals received from the quadrature encoder and corresponding to the first edge of the first channel until receipt of a new sensed edge signal corresponding to the first edge of the first channel when in the first output mode;
determining whether to change from the first mode to the second mode upon receipt of the new sensed edge signal while outputting an output signal corresponding to the new sensed edge signal; and
outputting signals corresponding to sensed edge signals that correspond to transitioning of at least one edge of the first channel or the second channel distinct from the first edge upon switching from the first mode to the second mode.

* * * * *